United States Patent [19]

Tabata et al.

[11] Patent Number: 4,579,625

[45] Date of Patent: Apr. 1, 1986

[54] METHOD OF PRODUCING A COMPLEMENTARY SEMICONDUCTOR DEVICE WITH A DIELECTRIC ISOLATION STRUCTURE

[75] Inventors: Akira Tabata, Zama; Motoshu Miyajima; Yoshifumi Kikuchi, both of Kawasaki, all of Japan

[73] Assignee: Fujitsu Limited, Kawasaki, Japan

[21] Appl. No.: 652,075

[22] Filed: Sep. 19, 1984

[30] Foreign Application Priority Data

Sep. 30, 1983 [JP] Japan .............................. 58-182006

[51] Int. Cl.[4] .................. H01L 21/306; B44C 1/22; C03C 15/00; C03C 25/06

[52] U.S. Cl. .................. 156/643; 29/576 W; 29/580; 156/646; 156/648; 156/649; 156/653; 156/657; 156/659.1; 156/661.1; 156/662; 148/175; 148/187; 357/44; 357/59

[58] Field of Search ............ 29/576 W, 580; 156/643, 156/646, 648, 649, 653, 657, 659.1, 661.1, 662; 148/1.5, 175, 187; 427/85, 86, 88, 93, 94; 357/44, 59; 430/313, 317

[56] References Cited

U.S. PATENT DOCUMENTS 4,396,460 8/1983 Tamaki et al. .................. 156/649 X
4,408,386 10/1983 Takayashiki et al. ............... 29/576

FOREIGN PATENT DOCUMENTS 0068679 5/1983 European Pat. Off. .

OTHER PUBLICATIONS

Electronics Engineers' Handbook, First Edition, McGraw-Hill Book Company, 1975, pp. 8-12, through 8-13.
IEEE Transactions on Electron Devices, vol. ED-28, No. 10, pp. 1199 through 1201, Oct. 1981, Nippon Telegraph and Telephone Public Corporation, Musashino Electrical Communication Laboratory, Midori-cho, Musashino-shi, Tokyo, Japan.
European Search Report.

Primary Examiner—William A. Powell
Attorney, Agent, or Firm—Staas & Halsey

[57] ABSTRACT

A method of producing a complementary semiconductor device having p-type islands and n-type islands in a dielectric isolation structure, including removing a projecting portion of a polycrystalline silicon layer, which is formed at the same time as the formation of an epitaxial silicon layer for one of two types of islands, so as to obtain an almost smooth exposed surface. The smooth surface contributes to the formation of a good masking pattern on the epitaxial silicon layer by a photoetching method, so that mesa portions for islands having exact dimensions are formed at predetermined positions.

14 Claims, 19 Drawing Figures

METHOD OF PRODUCING A COMPLEMENTARY SEMICONDUCTOR DEVICE WITH A DIELECTRIC ISOLATION STRUCTURE

BACKGROUND OF THE INVENTION (1) Field of the Invention

The present invention relates to a complementary semiconductor device with a dielectric isolation structure and, more particularly, to an improved method of producing a complementary epitaxial passivated integrated circuit (CEPIC) comprising n-type and p-type islands, each island having an element, such as a transistor, diode, or resistor, and being surrounded with a dielectric layer (e.g., a silicon dioxide ($SiO_2$) layer) supported with a thick polycrystalline silicon layer.

(2) Description of the Prior Art

A semiconductor device having a dielectric isolation structure is well known from, for example, FIGS. 8–16 and 8–17, Electronics Engineer's Handbook, McGraw-Hill Book Company, 1975, page 8–12. Such a semiconductor device is produced by the steps of; forming a V-shaped groove by anisotropically etching an n-type silicon substrate to form mesa portions; thermally oxidizing the exposed silicon of the substrate to form an oxide layer (i.e., a dielectric layer); depositing a thick, polycrystalline silicon layer on the oxide layer; turning the substrate upside down; lapping the substrate to expose the oxide layer at the bottom of the V-shaped groove and to form isolated n-type single crystalline islands; and forming transistors in the isolated islands, respectively. Each of the islands is completely isolated by surrounding it at the sides and bottom with the oxide layer having a thickness of several micrometers. Therefore, each of the formed transistors can have a very high breakdown voltage. In this case, all the islands are of either the p-type or n-type conductivity.

For the formation of a complementary circuit, however, a semiconductor device having both p-type islands and n-type islands is necessary (for example, cf. T. SAKURAI and K. KATO, IEEE Transactions on Electron Devices, Vol. ED-28, No. 10, pp. 1200–12 01, 1981). Such a device is referred to as a CEPIC.

When a p-type single crystalline substrate is used for p-type islands, for example, the n-type islands are formed as follows. The substrate is selectively etched to form mesa portions for the p-type islands. The mesa portions are covered with an insulating layer of, e.g. silicon dioxide ($SiO_2$). Silicon is epitaxially grown so as to form an n-type epitaxial single crystalline silicon layer on the exposed surface of the p-type substrate. At the same time, a polycrystalline silicon layer is formed on the insulating layer.

The thickness of the n-type epitaxial layer, corresponding to the height of the p-type mesa portions, is, e.g., approximately 60 $\mu$m for formation of a transistor having a breakdown voltage of, e.g., 400 V. In this case, the thickness of the polycrystalline silicon layer above the p-type mesa portions is approximately 85 $\mu$m, since the growth rate of the polycrystalline silicon is 1.4 times larger than that of the epitaxial silicon. Accordingly, the difference between the top surface of the polycrystalline silicon layer and that of the epitaxial layer is 85 $\mu$m.

Next, a masking layer (e.g., an $SiO_2$ layer or a dual layer of $SiO_2$ and $Si_2N_4$) is formed on the entire surface of the polycrystalline silicon layer and epitaxial layer. A photoresist layer is applied on the masking layer. The photoresist layer is selectively exposed by using a patterned photomask and is developed, so that the photoresist layer remains above portions of the epitaxial layer corresponding to the n-type islands. The masking layer, except the portion thereof covered with the remaining photoresist layer, is removed. Using the remaining masking layer as a mask, the polycrystalline silicon layer is removed and the epitaxial layer is selectively etched to form the n-type islands.

It is difficult, however, to position the n-type islands at predetermined positions with accuracy and to make them to the exact predetermined dimensions, since a large gap (e.g., 85 $\mu$m) exists between the photomask and the photoresist layer on the epitaxial layer, which results in distortion of the developed photoresist images. Therefore, it is difficult to make the CEPIC denser. Furthermore, since the photomask may come into contact with projecting portions of the polycrystalline silicon layer covered with the masking layer and the photoresist layer, the photomask is easily damaged.

SUMMARY OF THE INVENTION

An object of the present invention is to form p-type islands and n-type islands of a complementary semiconductor device with more accuracy.

Another object of the present invention is to provide an improved method of producing a denser complementary semiconductor device having a dielectric isolation structure.

The above and other objects of the present invention are attained by providing a method of producing a complementary semiconductor device, having at least one p-type island and at least one n-type island in a dielectric isolation structure, in which a projecting portion of a polycrystalline semiconductor layer simultaneously formed with an epitaxial layer and being above the level of a top surface of a mesa portion of a single crystalline semiconductor substrate for one of the at least two islands is removed, prior to selective formation of a masking layer corresponding to the another at least one island on the epitaxial layer by a photoetching method.

It is preferable to remove the projecting portion of the polycrystalline semiconductor layer in a self-alignment manner by utilizing a lapping or polishing method to remove a top portion of a protective layer on the projecting portion and by etching the projecting portion with a suitable etching method using the remaining protecting layer as a mask.

BRIEF DESCRIPTION OF THE DRAWINGS

The present invention and its objects and features will become more apparent during the course of the detailed description set forth below, rendered with reference to the accompanying drawings, in which.

DETAILED DESCRIPTION OF THE PREFERRED EMBODIMENTS

Referring to FIGS. 1 to 14, an explanation will be given of a method of producing a complementary semiconductor device having at least one p-type island and at least one n-type island in a dielectric isolation structure in accordance with a preferred embodiment of the present invention.

Figure 1:
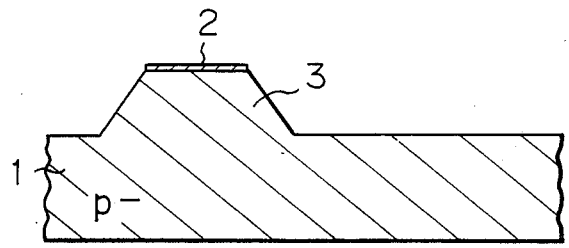
FIGS. 1 to 14 are schematic partially sectional views of a complementary semiconductor device having a dielectric isolation structure in various stages of production in accordance with the method of the present invention.

A single crystalline semiconductor substrate, e.g., a p⁻-type <100> silicon substrate is used as a starting material. The silicon substrate 1 (FIG. 1) is thermally oxidized to form an oxide layer 2 of $SiO_2$ having a thickness of, e.g., 600 nm. The oxide layer 2 is selectively etched by a conventional photoetching method using a photomask of a desired pattern for p-type islands. The silicon substrate 1 is selectively etched by using a preferable etchant of, e.g., a solution of potassium hydroxide (KOH), isopropyl alcohol (IPA), and ethyl alcohol (EA), to form a mesa portion 3 covered with the remaining oxide layer 2, as shown in FIG. 1. Since the solution can anisotropically etch a single crystalline silicon, the size of the p⁻-type mesa portion depends on the size of the remaining oxide layer 2.

Figure 2:
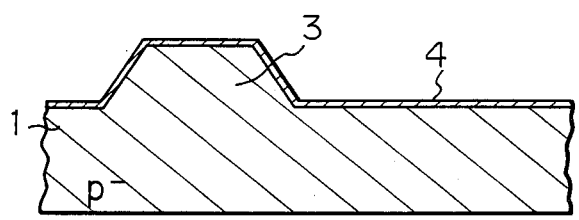

The oxide layer 2 is removed by a suitable etchant, then another oxide layer 4 of, e.g., $SiO_2$, and having a thickness of, e.g., 400 nm is formed on the entire surface of the silicon substrate 1 by a thermal oxidizing method or a chemical vapor deposition (CVD) method, as shown in FIG. 2.

Figure 3:
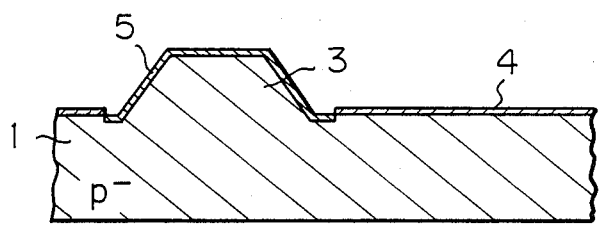

If it is necessary to form a p⁺-type buried layer in the p-type island for a desired transistor, a portion of the oxide layer 4 covering the mesa portion 3 is selectively etched by a conventional photoetching method to form an opening for impurity diffusion, as shown in FIG. 3. P-type impurities, e.g., boron, are doped into the mesa portion 3 by an ion-implantation method to form a p⁺-type region 5 as the buried layer.

Figure 4:
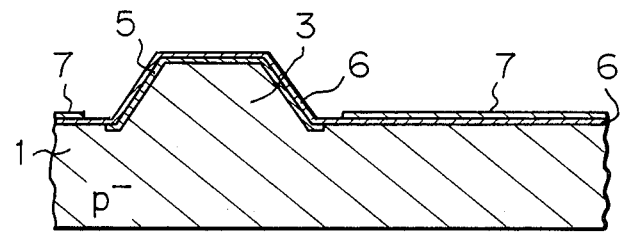

The oxide layer 4 is removed by a suitable etchant solution. Simultaneously, the silicon substrate 1 including the mesa portion 3 is slightly etched. Then the silicon substrate 1 including the mesa portion 3 is thermally oxidized to form an oxide layer 6 of, e.g., $SiO_2$, and having a thickness of, e.g., 100 nm, as shown in FIG. 4. During the thermal oxidation, the p⁺-type region 5 is activated. A nitride layer 7 of $Si_3N_4$ and having a thickness of, e.g., 200 nm, is formed on the oxide layer 6 by a CVD method and is selectively etched by a suitable etchant to expose the projecting portion of the mesa portion 3 and the oxide layer 6.

Figure 5:
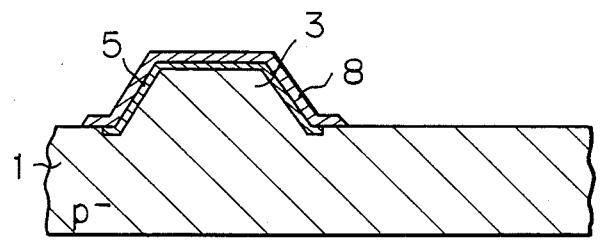

In order to form a relatively thick oxide layer covering the mesa portion 3, the mesa portion 3 is further thermally oxidized to form a thick insulating layer 8 of $SiO_2$ and having a thickness of, e.g., 2 μm, as shown in FIG. 5. The nitride layer 7 is removed by using a boiling phosphoric acid solution or by a plasma etching method. Then, the oxide layer 6 remaining on the silicon substrate 1 is removed by a suitable etching method and the exposed surface of the silicon substrate 1 is cleaned by slightly etching it. At the same time, the thick insulating layer 8 is inevitably etched to a thickness of slightly more than 100 nm.

Figure 6:
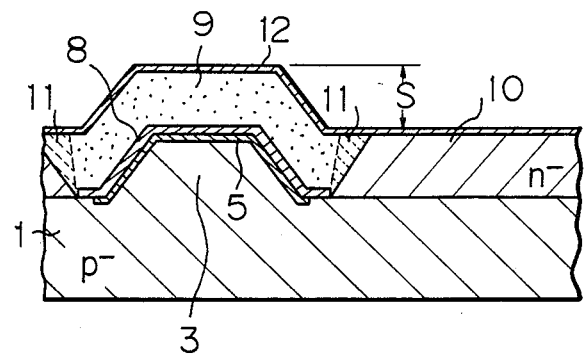

When a semiconductor material, e.g., silicon, is deposited on the exposed surface by an epitaxial growth method, a polycrystalline silicon layer 9 is formed on the thick insulating layer 8 and an n⁻-type single crystalline (epitaxial) silicon layer 10 is formed on the clean surface of the silicon substrate 1, as shown in FIG. 6. There is a transition portion 11 of silicon between the polycrystalline silicon layer 9 and the epitaxial silicon layer 10. Then, a protective layer 12 of, e.g., $SiO_2$, and having a thickness of, e.g., 500 nm, is formed on the entire exposed surface by a CVD method. The thickness of the epitaxial silicon layer 10 is, generally, almost equal to the height of the mesa portion 3. If a transistor having a breakdown voltage of 400 V is desired, it is preferable to make the epitaxial silicon layer 10–60 μm thick. Since the growth rate of polycrystalline silicon is 1.4 times larger than that of single crystalline (epitaxial) silicon, a polycrystalline silicon layer 9 having a thickness of approximately 85 μm is formed. Therefore, the difference "S" (FIG. 6) between the portions of the protective layer 12 on the polycrystalline silicon layer 9 and on the epitaxial silicon layer 10 becomes 85 μm.

Figure 7:
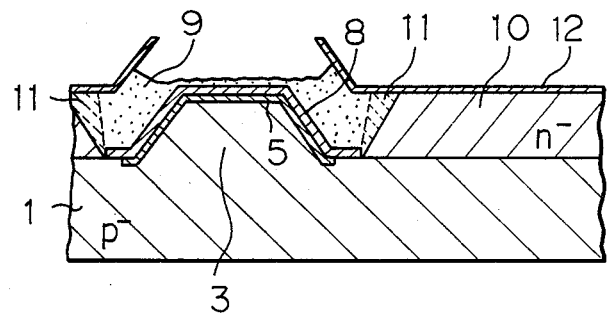

In order to remove a portion of the polycrystalline silicon layer 9 above the level of the top surface of the thick insulating layer 8 without using a photoetching method in accordance with the present invention, the top portion of the protective layer 12 above the mesa portion 3 is removed by a lapping or polishing method, and the polycrystalline silicon layer 9 is etched by using a KOH solution or a solution of nitric acid ($HNO_3$) and hydrofluoric acid (HF), as shown in FIG. 7. In the case of FIG. 7, a thin portion of the polycrystalline silicon layer 9 remains on the thick insulating layer 8. However, the top surface of the thick insulating layer 8 may be exposed. These etching solutions can etch $SiO_2$, so that the protective layer 12 of $SiO_2$ thins to a thickness of, e.g., 200 nm. Furthermore, the protective layer 12 is washed out by a suitable etchant, e.g., an HF solution.

Figure 8:
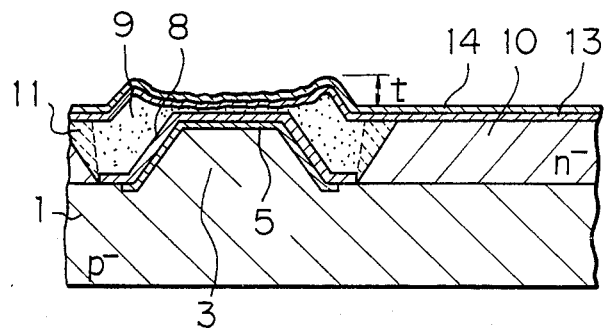

Next, a first masking layer 13 (for removal of the polycrystalline silicon layer 9 of, e.g., $SiO_2$), and having a thickness of, e.g., 500 nm, is formed on the entire exposed surface by a CVD method, as shown in FIG. 8. It is possible to form the $SiO_2$ masking layer 13 by a thermal oxidation method. However, a CVD $SiO_2$ layer is preferable to an oxidation $SiO_2$ layer, since the etching rate of CVD $SiO_2$ is 1.1 to 1.2 times larger than that of oxidation $SiO_2$. Then a second masking layer 14 (for selective removal of the epitaxial layer 10) of, e.g., $Si_3N_4$, and having a thickness of, e.g., 150 nm, is formed on the first masking layer 13 by a CVD method. The difference "t" (FIG. 8) between the portions of the second masking layer 14 on the polycrystalline silicon layer 9 and on the epitaxial layer 10 is less than several micrometers. It is possible to make the difference "t" zero or minus.

Figure 9:
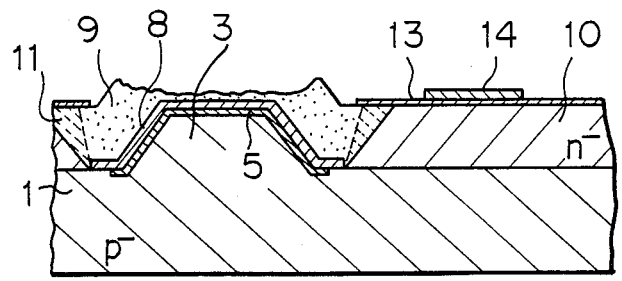

In order to selectively etch the second masking layer 14 to leave portions thereof corresponding to n-type islands, as shown in FIG. 9, a photoresist layer (not shown) is applied on the second masking layer 14, exposed through a photomask having a predetermined pattern, and developed. Using the developed photoresist layer as a mask, the second masking layer 14 is etched by a suitable etching method. In such a photolithography process, there is no large gap between the photomask and the photoresist layer, which results in accurate formation of developed photoresist images. Accordingly, the position and size of the remaining layer 14 correspond exactly to predetermined values. The photoresist layer (not shown) is removed, then another photoresist layer is applied on the entire exposed surface for selectively etching the first masking layer 13. The other photoresist layer is exposed and developed to remove a portion thereof above the mesa portion 3. Using the other photoresist layer as a mask, the first masking layer 13 is etched by a suitable etchant to expose the polycrystalline silicon layer 9, as shown in FIG. 9. It is possible to carry out the selective removal of the second and first masking layers 14 and 13 by first, selectively etching both the layers 14 and 13 to expose the polycrystalline silicon layer 9 and second, selectively etching the layer 14 only.

Figure 10:
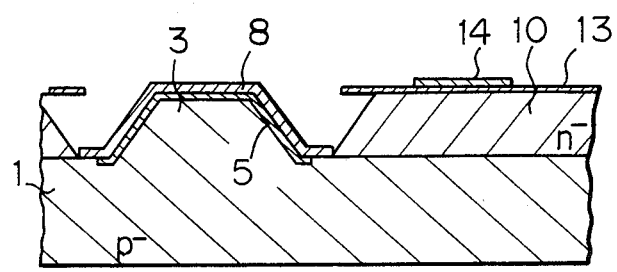

The polycrystalline silicon layer 9 and the transition portion 11 are etched by a wet etching method using a KOH solution or a solution of HF+HNO$_3$ or a dry etching using a mixture gas of SiCl$_4$ and BCl$_3$, as shown in FIG. 10.

Figure 11:
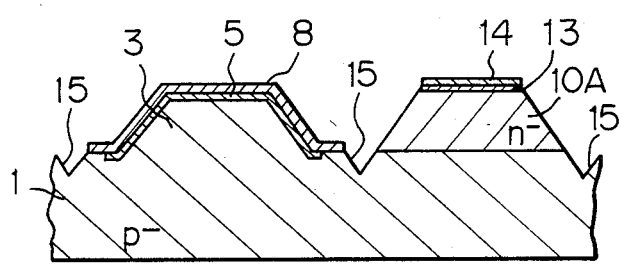

Then, the first masking layer 13 of SiO$_2$ is selectively etched by a suitable etching method using the second masking layer 14 of Si$_3$N$_4$ as a mask, as shown in FIG. 11. During the etching steps of the polycrystalline silicon layer 9 and the second masking layer 13, the thick insulating layer 8 of SiO$_2$ is also etched. However, the insulating layer 8 is sufficiently thick to still remain on the mesa portion 3.

Then, the epitaxial silicon layer 10 is anisotropically etched by a solution of KOH, IPA, and EA to form an n$^-$-type mesa portion 10A under the remaining masking layers 13 and 14, as shown in FIG. 11. Furthermore, the etching solution etches anisotropically the silicon substrate 1 to form V-shaped grooves 15.

Figure 12:
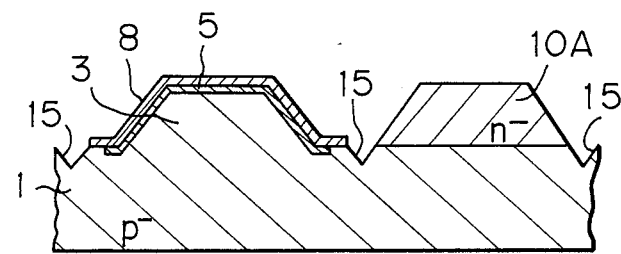

The second masking layer 14 is removed and the first masking layer 13 is removed by a suitable etching method, as shown in FIG. 12.

Figure 13:
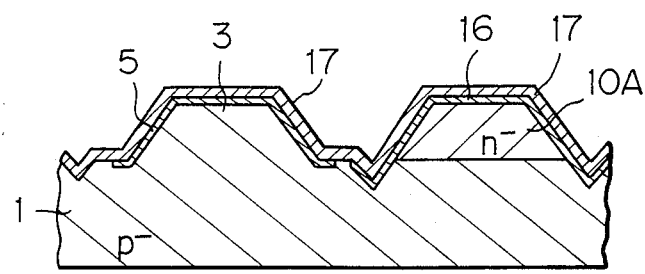

If it is necessary to form an n$^+$-type buried layer in an n$^-$-type island for a desired transistor, n-type impurities, e.g., phosphorus, are doped into the n$^-$-type mesa portion 10A and the exposed portions of the silicon substrate 1 by an ion-implantation method to form a p$^+$-type region 16 as the buried layer, as shown in FIG. 13. In this case, the insulating layer 8 may serve as a mask. If necessary, a photoresist pattern covering the insulating layer 8 is formed prior to the ion-implantation. The exposed silicon of the mesa portion 10A and the substrate 1 is thermally oxidized to a thick insulating layer 17 of SiO$_2$ and having a thickness of, e.g., 2.1 μm. At the same time, the p-type mesa portion 3 is also oxidized to increase the thickness of the insulating layer 8, which becomes the thick insulating layer 17.

Figure 14:
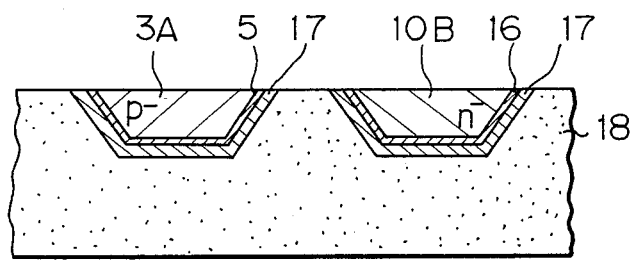

Next, a very thick polycrystalline silicon layer 18 serving as a supporting layer is formed on the insulating layer 17, as shown in FIG. 14. The silicon substrate 1 is backlapped to expose the n-type mesa portion 10A and the polycrystalline silicon layer 18. Namely, the p-type mesa portion 3 and the n-type mesa portion 10A are isolated (hereinafter these portions being referred to as a p-type island 3A and an n-type island 10B, respectively). Thus the islands 3A and 10B are completely isolated from each other by the thick insulating layer 17 of SiO$_2$ surrounding the islands.

Figure 15:
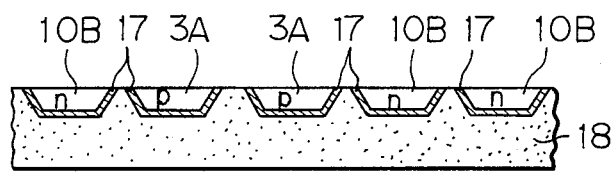
FIG. 15 is a schematic partially sectional view of the obtained complementary semiconductor device having p-type islands and n-type islands.

Thus, a substrate for a complementary semiconductor device of a CEPIC comprising the polycrystalline silicon supporting layer 18 and a large number of p-type islands 3A and n-type islands 10B can be obtained, as shown in FIG. 15.

Next, transistors (e.g., bipolar transistors or field effect transistors) are produced in the obtained islands by a conventional method so as to complete the semiconductor device. For example, a complementary semiconductor device comprising a pnp-type bipolar transistor and an npn-type bipolar transistor is produced in the following manner.

Figure 16:
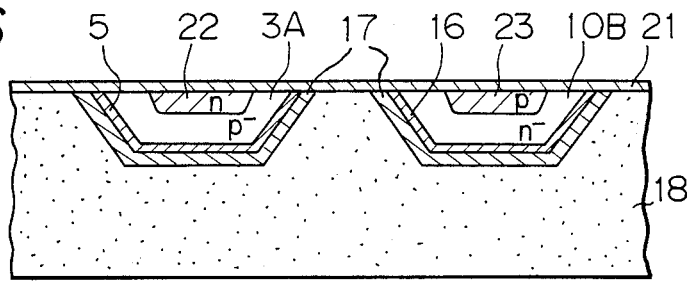
FIGS. 16 to 19 are schematic partially sectional views of a dielectric isolation structure formed according to the present invention and used in a complementary bipolar transistor integrated circut in various stages of production in accordance with a prior art technique.

An SiO$_2$ layer 21 is formed on all the exposed surfaces of the p-type island 3A, the n-type island 10B, and the polycrystalline silicon supporting layer 18 by a CVD method or a thermal oxidation method, as shown in FIG. 16. N-type impurities are doped into the p-type island 3A through a patterned resist layer (not shown) to form an n-type region 22 by an ion-implantation method. For example, phosphorus ions are implanted at an energy of 100 keV to a dosage of $27 \times 10^{14}$ cm$^{-2}$. Then p-type impurities are doped into the n-type island 10B through another patterned resist layer (not shown) to form a p-type region 23 by an ion-implantation method. For example, boron ions are implanted at an energy of 180 keV to a dosage of $6 \times 10^{14}$ cm$^{-2}$. The n-type region 22 and the p-type region 23 (i.e., the implanted ions) are activated by annealing, e.g., at a temperature of 1200° C., for a period of 45 minutes under an atmosphere of dry nitrogen to become the n-type base region 22 and the p-type base region 23, respectively.

Figure 17:
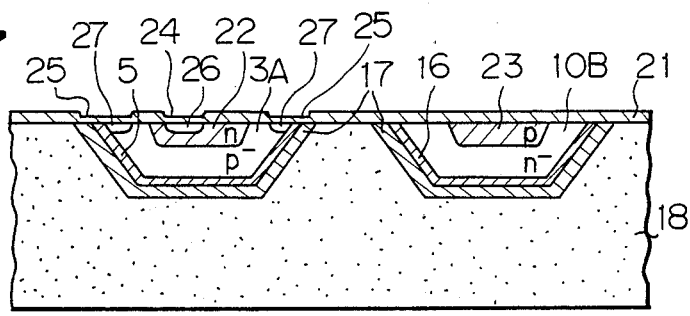

The SiO$_2$ layer 21 is selectively etched so as to form thin portions 24 and 25 at the p-type island 3A, as shown in FIG. 17. P-type impurities, e.g., boron, are doped into the n-type base region 22 and the island 3A through the thin portions 24 and 25, by an ion-implantation method, so that a p-type emitter region 26 is formed within the n-type base region 22 and a collector contact region 27 is formed so as to join with the p-type buried layer 5.

Figure 18:
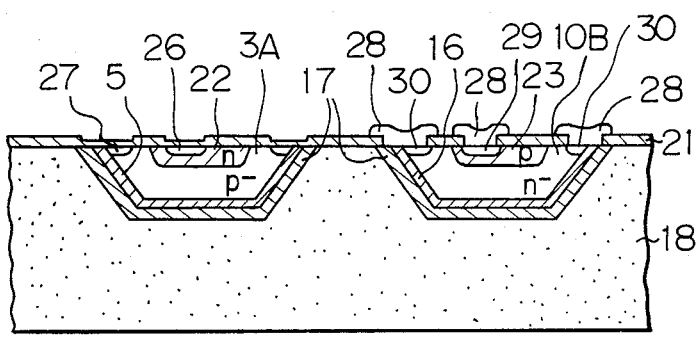

Then, the SiO$_2$ layer 21 is selectively etched so as to expose a portion of the p-type base region 23 and a portion of the n-type island 10B, as shown in FIG. 18. A phosphosilicate glass (PSG) layer 28 containing, e.g., 14% phosphorus, and having a thickness of, e.g., 2.5 μm, is deposited on the entire exposed surface and is selectively etched to remain on the exposed portions. Phosphorus thermally diffuses into the p-type base region 23 and the n-type island 10B out of the PSG layer 28 by heat treatment, so that an n-type emitter region 29 is formed within the p-type base region 23 and a collector contact region 30 is formed so as to join with the n-type buried layer 16 (FIG. 18). The PSG layer 28 is washed out.

Figure 19:
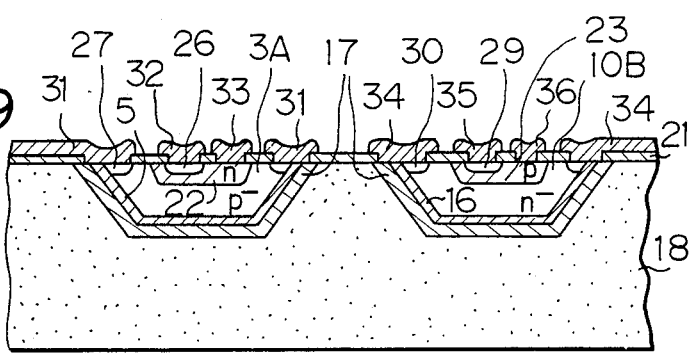

Next, the thin portions 24 and 25 of the SiO$_2$ layer 21 are removed to form contact windows. A conductive layer, e.g., an aluminium layer, is deposited on the entire exposed surface and is selectively etched (i.e., patterned) to form electrodes 31 to 36, as shown in FIG. 19. The electrodes comprise a collector electrode 31, an emitter electrode 32, and a base electrode 33 for the pnp-type bipolar transistor and a collector electrode 34, an emitter electrode 35, and a base electrode 36 for the npn-type bipolar transistor. Thus, the obtained pnp-type transistor and npn-type transistor are formed by utilizing the p-type island and the n-type island, respectively, and are elements of the complementary semiconductor device.

It will be obvious that the present invention is not restricted to the above-mentioned embodiments and that many variations are possible for persons skilled in the art without departing from the scope of the invention.

We claim:

1. A method of producing a complementary semiconductor device having at least one p-type island and at least one n-type island in a dielectric isolation structure, comprising the steps of:

(a) forming a first mesa portion of a single crystalline semiconductor substrate having a first conductivity type;

(b) covering said first mesa portion only with a first insulating layer;

(c) epitaxially growing a semiconductor material to form a polycrystalline semiconductor layer on said first insulating layer and to form a single crystalline semiconductor layer of a second conductivity type, opposite said first conductivity type, on the exposed surface of said substrate;

(d) forming a protective layer on said polycrystalline semiconductor layer and single crystalline semiconductor layer;

(e) selectively removing said protective layer from a top portion of said first mesa portion; and (f) removing said exposed polycrystalline semiconductor layer of said first mesa portion by using the remainder of said protective layer as a mask.

2. A method according to claim 1, further comprising the steps of:

(g) selectively forming a first masking layer on said single crystalline semiconductor layer;

(h) removing the remaining polycrystalline semiconductor layer;

(i) forming a second mesa portion of said single crystalline layer by selectively etching said single crystalline layer by utilizing said first masking layer;

(j) removing said first masking layer;

(k) covering the exposed surfaces of said second mesa portion and said substrate, including said first mesa portion, with a second insulating layer;

(l) forming a supporting layer on said second insulating layer; and (m) backlapping said substrate to island said first and second mesa portions and to expose portions of said second insulating layer, wherein steps (g) through (m) are performed after step (f).

3. A method according to claim 1, wherein said step (e) of selectively removing said protective layer is carried out by a lapping method.

4. A method according to claim 1, wherein in said forming step (c) of the first mesa portion, an anisotropic etchant is used.

5. A method according to claim 1, further comprising the steps of:

(n) removing the remainder of said protective layer; and (o) forming a second masking layer on the first making layer on a top portion of said second mesa portion;

wherein steps (n) and (o) occcur after said selectively forming step (g) of the first masking layer.

6. A method according to claim 5, further comprising the step of:

(p) selectively etching said second masking layer to form a mask for the removal of said remaining polycrystalline semiconductor layer prior to said removal of the remainder of the protective layer in step (n).

7. A method according to claim 2, wherein, in said forming step (i) of the second mesa portion, an anisotropic etchant is used.

8. A method according to claim 1, wherein said single crystalline semiconductor substrate is silicon.

9. A method according to claim 1, wherein said semiconductor material is silicon.

10. A method according to claim 2, wherein said supporting layer is polycrystalline silicon.

11. A method of producing a complementary semiconductor device having at least one p-type island and at least one n-type island in a dielectric isolation structure, comprising the steps of:

(a) forming a first mesa portion of a single crystalline semiconductor substrate having a first conductivity type;

(b) covering said first mesa portion only with a first insulating layer; and (c) epitaxially growing a semiconductor material to form a polycrystalline semiconductor layer on said first insulating layer and to form a single crystalline semiconductor layer of a second conducitivity type, opposite said first conductivity type, on the exposed surface of said substrate;

(d) forming a protective layer on said pooycrystalline semiconductor layer and single crystalline semiconductor layer;

(e) selectively removing said protective layer from a top portion of said first mesa portion;

(f) removing said exposed polycrystalline semiconductor layer of said first mesa portion by using the remainder of said protective layer as a mask;

(g) removing the remainder of said protective layer;

(h) forming a first masking layer on the entire exposed surface;

(i) selectively forming a second masking layer on said first masking layer above said single cyrstalline semiconductor layer;

(j) selectively removing the first and second masking layers from a top portion of the first mesa portion;

(k) removing the remaining polycrystalline semiconductor layer;

(l) forming a second mesa portion of said single crystalline layer by selectively etching said single crystalline layer by utilizing said first and second masking layers;

(m) removing said first and second masking layers;

(n) covering the exposed surfaces of said second mesa portion and said substrate, including said first mesa portion, with a second insulating layer;

(o) forming a supporting layer on said second insulating layer; and (p) backlapping said substrate to expose portions of said second insulating layer and to isolate said first and second mesa portions.

12. The method according to claim 11, wherein said step (e) of selectively removing said protective layer is carried out by a lapping method.

13. The method according to claim 12, wherein, in said forming step (c) of the first mesa portion, an anisotropic etchant is used.

14. The method according to claim 13, wherein, in said forming step (1) of the second mesa portion, an anisotropic etchant is used.

* * * * *